United States Patent
Sumida et al.

(10) Patent No.: US 6,639,278 B2
(45) Date of Patent: Oct. 28, 2003

(54) SEMICONDUCTOR DEVICE

(75) Inventors: Wataru Sumida, Tokyo (JP); Michiaki Maruoka, Shiga (JP); Akihiro Shimomura, Shiga (JP); Manabu Yamada, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 26 days.

(21) Appl. No.: 10/057,642

(22) Filed: Jan. 25, 2002

(65) Prior Publication Data
US 2002/0096715 A1 Jul. 25, 2002

(30) Foreign Application Priority Data
Jan. 25, 2001 (JP) .................................. 2001-017303

(51) Int. Cl.⁷ ........................................... H01L 31/119
(52) U.S. Cl. ...................... 257/342; 257/341; 257/346; 257/288
(58) Field of Search .................. 257/342, 341, 257/346, 288, 401, 775, E29.189, E29.274

(56) References Cited

U.S. PATENT DOCUMENTS 4,994,871 A * 2/1991 Chang et al. ............... 257/139
5,223,732 A * 6/1993 Clark .......................... 257/327
6,091,108 A * 7/2000 Harris et al. ................. 257/339
6,246,092 B1 * 6/2001 Fujihira et al. ............. 257/341

FOREIGN PATENT DOCUMENTS

| JP | 1-209766 | 8/1989 | |
| JP | 09-191109 | 7/1997 | |
| JP | 09-213939 | 8/1997 | |
| JP | 10-173175 | * 9/1998 | ........... H01L/29/78 |
| JP | 11-501458 | 2/1999 | |
| JP | 2000-286415 | 10/2000 | |

* cited by examiner

*Primary Examiner*—Jasmine Clark
(74) *Attorney, Agent, or Firm*—Katten Muchin Zavis Rosenman

(57) ABSTRACT

At one of main surfaces of a silicon substrate serving as an N+type drain region is arranged an N type first high resistance drift layer. On the first high resistance drift layer is arranged an N−type second high resistance drift layer. A P−type high resistance buried layer is arranged on the surface layer of the first high resistance drift layer and the bottom layer of the second high resistance drift layer at a position right under each of a plurality of P type base regions arranged on the surface layer of the second high resistance drift layer. The thickness T1 of the first high resistance drift layer is set in such a manner that a depletion layer extending over the first high resistance drift layer reaches through the drain region at a voltage lower than a sharing voltage V1 shared by the first high resistance drift layer.

9 Claims, 5 Drawing Sheets

SEMICONDUCTOR DEVICE

BACKGROUND OF THE INVENTION

1. Field of the Invention

The present invention relates to a semiconductor device comprising a vertical type MOSFET.

2. Description of the Related Art

In a MOSFET, the trade-off relationship is established between an ON resistance and a withstand voltage. In general, when the withstand voltage of a MOSFET is high, an ON resistance thereof becomes large. For this reason, many proposals have been conventionally made in order to improve the relationship.

Hereinafter, a description will be given of a vertical type MOSFET disclosed in unexamined Japanese Patent Publication (KOKAI) No. 9-191109 in reference to FIG. 8.

In FIG. 8, reference numeral 1 designates an N+ type silicon substrate serving as an N+ type drain region. At one of main surfaces of the silicon substrate 1 is formed an N− type high resistant drift layer 2 on a lower stage by an epitaxial growth, and further, a lower P type buried layer 3 is formed on a surface layer of the high resistant drift layer 2. On the high resistant drift layer 2 having the P type buried layer 3 formed thereon is formed an N− type high resistant drift layer 4 on a middle stage by an epitaxial growth, and further, an upper P type buried layer 5 is formed on a surface layer of the high resistant drift layer 4. On the high resistant drift layer 4 having the P type buried layer 5 formed thereon is formed an N− type high resistant drift layer 6 on an upper stage by an epitaxial growth. Thereafter, by using a well-known technique, a P type base region 7, an N+ type source region 8, a gate oxide film 9, a gate electrode 10, an interlayer insulating film 11 and a source electrode 12 are formed on the surface layer of the high resistant drift layer 6 and over the high resistant drift layer 6, and further, a drain electrode 13 is formed on the other main surface of the silicon substrate 1.

The high resistant drift layers 2, 4 and 6 are designed such that the relationships between sharing voltages V1, V2 and V3 sharing a withstand voltage VB between the source electrode 12 and the drain electrode 13 and impurity concentrations N1, N2 and N3 satisfy the following conditions:

$$N1 < 1.897 \times 10^{18} \times V1^{-1.35} [\text{cm}^{-3}] \quad (1)$$

$$N2 < 1.897 \times 10^{18} \times V1^{-1.35} [\text{cm}^{-3}] \quad (2)$$

$$N3 < 1.897 \times 10^{18} \times V1^{-1.35} [\text{cm}^{-3}] \quad (3)$$

The relationships between the impurity concentrations N1, N2 and N3 and the sharing voltages V1, V2 and V3 of the high resistant drift layers 2, 4 and 6 must satisfy that the impurity concentrations N1, N2 and N3 become lower as the sharing voltages V1, V2 and V3 become higher in accordance with the above expressions (1) to (3). Furthermore, the thickness T1 of the high resistant drift layer 2 need be great in such a manner as to prevent any reach-through. However, the present inventors simulated the interrelationship among the withstand voltage and the impurity concentration, thickness and ON resistance of the high resistant drift layer, and found that optimum values of the impurity concentration and thickness of the high resistant drift layer exist, respectively, on condition that the ON resistance is minimum at a predetermined withstand voltage.

SUMMARY OF THE INVENTION

The present invention has been accomplished to utilize the feature that optimum values of the impurity concentration and thickness of a high resistance drift layer exist, respectively, on condition that an ON resistance is minimum. An object of the present invention is to provide a novel semiconductor device in which the trade-off relationship between an ON resistance and a withstand voltage can be more improved.

Technical configurations described below are basically taken according to the present invention in order to achieve the above-described object.

A first aspect of the present invention provides a semiconductor device comprising: a semiconductor substrate serving as a drain region of one conductive type; a first high resistance drift layer of one conductive type provided on a surface of the semiconductor substrate; second to (n+1)th high resistance drift layers of one conductive type provided on the first high resistance drift layer (wherein n is an integer of 1 or more); a base region of other conductive type provided on a surface layer of the (n+1)th high resistance drift layer; a source region of one conductive type provided on a surface layer of the base region; a first high resistance buried layer of other conductive type provided on a surface layer of the first high resistance drift layer and a bottom layer of the second high resistance drift layer at a position right under the base region; second to nth high resistance buried layers of other conductive type respectively provided on surface layers of the second to nth high resistance drift layers and bottom layers of the third to (n+1)th high resistance drift layers at a position right under the base region; a gate electrode provided on the base region held between the (n+1)th high resistance drift layer and the source region via a gate oxide film; a source electrode in ohmic contact with the source region over the base region and the source region; and a drain electrode provided on the other surface of the semiconductor substrate; wherein thickness of the first high resistance drift layer being established in such a manner that a depletion layer formed within the first high resistance drift layer reaches through the drain region, when a voltage lower than a sharing voltage shared by the first high resistance drift layer out of a predetermined withstand voltage between the source electrode and the drain electrode is applied to a PN junction between the first high resistance buried layer and the first high resistance drift layer.

In the second aspect of the present invention, the thickness of the first high resistance drift layer is established in such a manner that an ON resistance becomes minimum at a predetermined withstand voltage of the semiconductor device by using a graph in which variables thereof are an ON resistance, a withstand voltage and a thickness of the first high resistance drift layer of the semiconductor device.

In the third aspect of the present invention, the thickness of the first high resistance drift layer is established in such a manner that the withstand voltage of the semiconductor device becomes maximum by using a graph in which variables thereof are an ON resistance, a withstand voltage and a thickness of the first high resistance drift layer of the semiconductor device.

In the fourth aspect of the present invention, an impurity concentration of the first high resistance drift layer is an impurity concentration at a maximum withstand voltage of the semiconductor device.

In the fifth aspect of the present invention, the thickness of the first high resistance drift layer is smaller than that of each of the second to (n+1)th high resistance drift layers.

In the sixth aspect of the present invention, an impurity concentration of the first high resistance drift layer is larger than that of each of the second to (n+1)th high resistance drift layers.

In the seventh aspect of the present invention, the semiconductor device further comprising: a plurality of guard ring layers of other conductive type provided on a surface layer of the (n+1)th high resistance drift layer so as to surround the plurality of base regions; a plurality of first buried guard ring layers of other conductive type provided on the surface layer of the first high resistance drift layer and the bottom layer of the second high resistance drift layer under the guard ring layer so as to surround the first high resistance buried layer; and a plurality of second to nth buried guard ring layers of other conductive type provided on surface layers of the second to nth high resistance drift layers and bottom layers of the third to (n+1)th high resistance drift layers under the guard ring layer so as to respectively surround the second to nth high resistance buried layers.

DESCRIPTION OF THE PREFERRED EMBODIMENTS (First Embodiment)

A vertical type MOSFET having a gate planar structure in a first embodiment according to the present invention will be described below with reference to FIG. 1.

Figure 1:
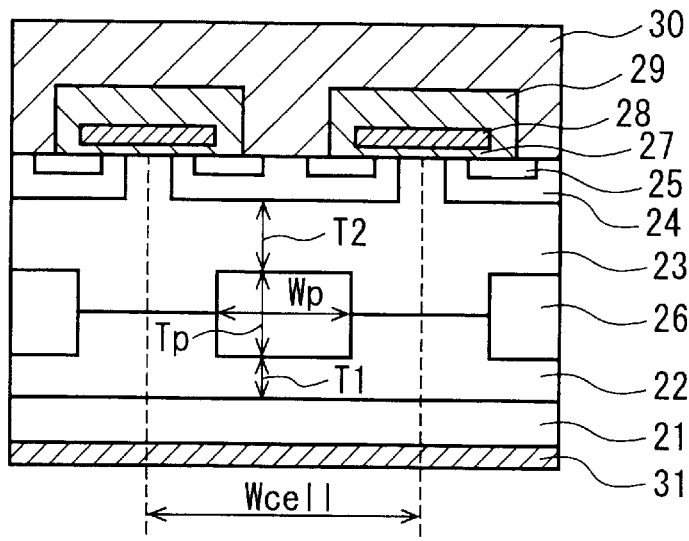
FIG. 1 is a cross-sectional view showing essential parts of a MOSFET according to a first preferred embodiment in the present invention.

In FIG. 1, reference numeral 21 designates an N+ type silicon substrate serving as an N+ type high-concentration drain region of one conductive type. At one of main surfaces of the silicon substrate 21 is arranged an N–type low-concentration first high resistance drift layer 22 of one conductive type. On the first high resistance drift layer 22 is arranged an N–type second high resistance drift layer 23. A plurality of P type base regions 24 of the other conductive type in a planar pattern of a square cell are arranged on the surface layer of the second high resistance drift layer 23. An N+ type source region 25 is arranged on the surface layer of the base region 24. A P– type low-concentration high resistance buried layer 26 of the other conducive type in a square planar pattern is arranged on the surface layer of the first high resistance drift layer 22 and the bottom layer of the second high resistance drift layer 23 at a position right under each of the base regions 24. A gate electrode 28 is arranged over the base region 24 held between the second high resistance drift layer 23 and the source region 25 via a gate oxide 27. A source electrode 30 that is insulated from the gate electrode 28 via an interlayer insulating film 29 is arranged in ohmic contact with the source region 25 over the base region 24 and the source region 25. A drain electrode 31 is arranged at the other main surface of the silicon substrate 21. Reference character Wcell represents a cell size; T1, the thickness of the first high resistance drift layer 22; T2, the thickness of the second high resistance drift layer 23; Wp, the width of the high resistance buried layer 26; and Tp, the thickness of the high resistance buried layer 26.

Here, the thickness T1 represents the shortest distance between the silicon substrate 21 and the high resistance buried layer 26; and the thickness T2 represents the shortest distance between the base region 24 and the high resistance buried layer 26. With the above-described arrangement, the impurity concentration N1 and thickness T1 of the first high resistance drift layer 22, which is a feature of the present invention, are set to optimum values, respectively, on condition that an ON resistance becomes minimum when the first high resistance drift layer 22 shares a sharing voltage V1 of a withstand voltage VB between the source and drain electrodes in the MOSFET.

Subsequently, explanation will be made on a design example of the MOSFET having the above-described arrangement. The withstand voltage VB between the source and drain electrodes in the MOSFET is set to 300 V, and a withstand voltage VB of 300 V is shared between the first high resistance drift layer 22 and the second high resistance drift layer 23 by the equal amount, i.e., at voltages V1 and V2 of 150 V.

First, a description will be given below of a design example of the impurity concentration N2 and thickness T2 of the second high resistance drift layer 23.

Figure 2:
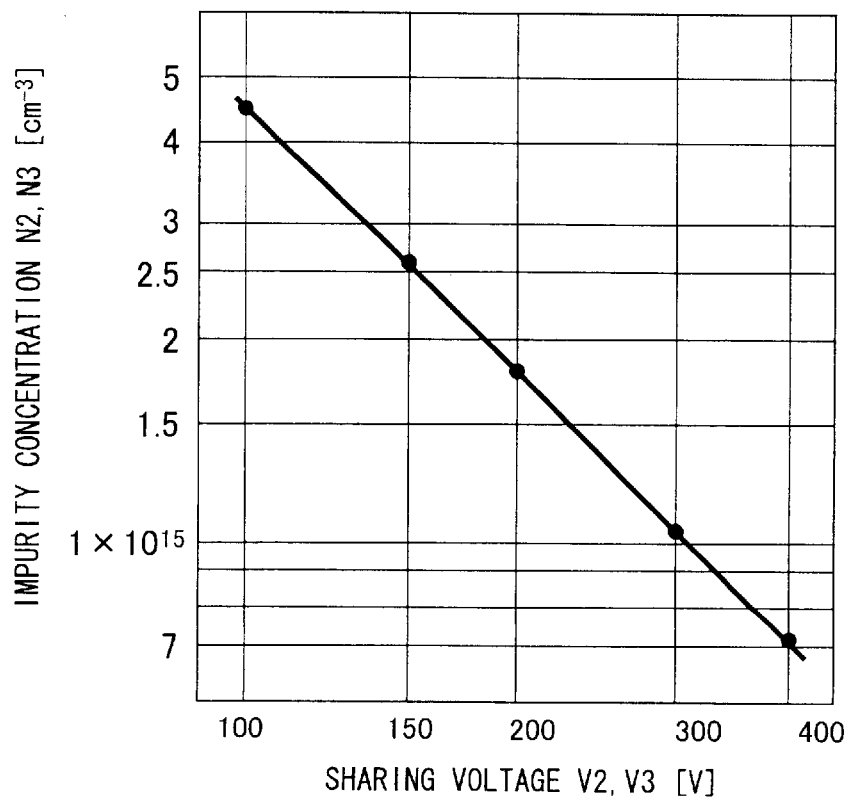
FIG. 2 is a graph illustrating the relationship between an impurity concentration and a withstand voltage at a plain junction.

The relationship between the sharing voltage V2 and the impurity concentration N2, which are variables, is simulated, and then, is expressed by a graph of FIG. 2 based on the simulation result. From FIG. 2, the impurity concentration N2 of the second high resistance drift layer 23 is $2.3 \times 10^{15}$ [cm$^{-3}$] with a tolerance of 10% with respect to a sharing voltage V2 of 150 V. The impurity concentration N2 may be designed to take a tolerance other than 10% with respect to a sharing voltage V2 of 150 V, as required.

In the meantime, the thickness T2 is set to a dimension lower than the E critical (i.e., an electric field critical value at which an avalanche breakdown occurs) by using the conventional technique for designing a guard ring on a periphery. In the present embodiment, the thickness T2 is designed to be 6 $\mu$m to 7 $\mu$m.

Next, a description will be given below of a design example of the high resistance buried layer 26. The high resistance buried layer 26 is arranged at the position right under the center of each of the base regions 24. The width Wp of the high resistance buried layer 26 is so great that the ON resistance is increased caused by a JFET component between the high resistance buried layers 26; in contrast, the Wp is so small that an electric field strength at a position most apart from the high resistance buried layer 26 is increased. Therefore, the width Wp is designed to become substantially half of the cell size Wcell. Moreover, the thickness Tp of the high resistance buried layer 26 is designed to become substantially equal to the width Wp, and further, the resistivity of the high resistance buried layer 26 is designed to become substantially equal to that of the second high resistance drift layer 23.

Subsequently, a description will be given below of a design example of the impurity concentration N1 and thickness T1 of the first high resistance drift layer 22. At a PN junction, the relationship between the withstand voltage VB, at which a depletion layer formed within an N-layer extending from the PN junction reaches through an N+layer, and the maximum thickness TMAX of the N-layer can be expressed as one model as follows:

$$TMAX = 2.045 \times 10^{-6} \times VB^{1.15} \text{ [cm]} \quad (4)$$

When the maximum thickness T1MAX of the first high resistance drift layer 22, at which the depletion layer formed within the first high resistance drift layer 22 extending from the PN junction between the high resistance buried layer 26 and the first high resistance drift layer 22 reaches through the drain layer 21, at a sharing voltage V1 of 150 V, is determined in accordance with the equation (4), the maximum thickness T1MAX can be expressed by the following equation:

$$T1MAX = 6.5 \, \mu m \quad (5)$$

Next, the simulation results of the relationship between the withstand voltage VB and a normalized ON resistance Ron in the MOSFET in which the second high resistance drift layer 23 and the high resistance buried layer 26 are designed as described above, while the impurity concentration N1, thickness T1 and sharing voltage V1 of the first high resistance drift layer 22 are variables, can be expressed in a three-dimensional graph in which an X axis represents the ON resistance Ron, a Y axis represents the withstand voltage VB and a Z axis represents the thickness T1. For the sake of simplicity of the illustration, the relationship is expressed in FIG. 3 being a two-dimensional graph in which an X axis represents the ON resistance Ron and a Y axis represents the withstand voltage VB while the thickness T1 at around T1MAX of 6.5 $\mu m$ expressed by the equation (5) takes six levels, i.e., 2, 3, 4, 5, 6 and 7 $\mu m$. Dots plotted at each of the levels of T1 represent values of the impurity concentration N1. The respective values on each curves of T1 from 2 $\mu m$ to 6 $\mu m$ are arranged in the same order as that at the curve of T1 of 7 $\mu m$.

Figure 3:
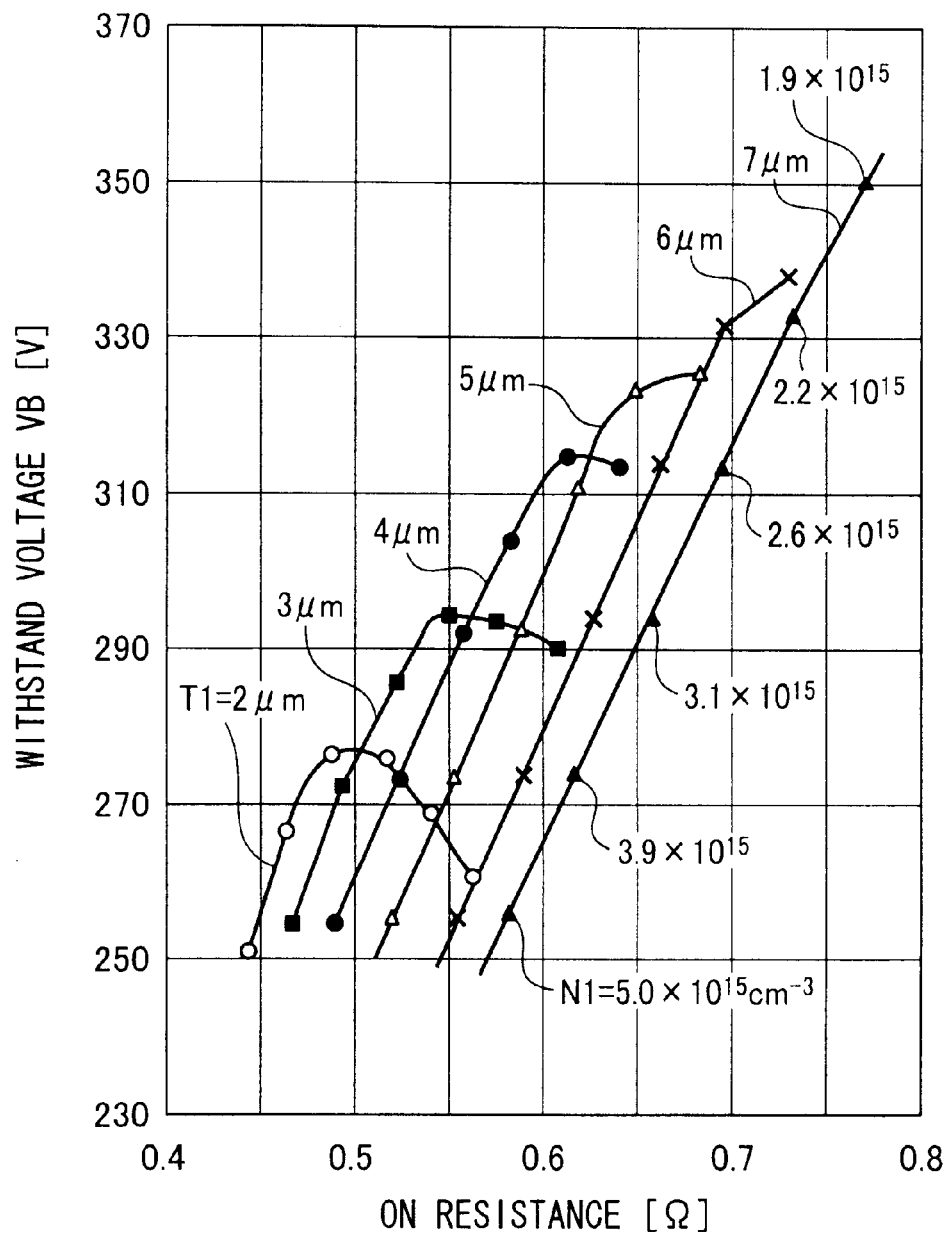
FIG. 3 is a graph illustrating the relationship between an ON resistance and the withstand voltage of the MOSFET shown in FIG. 1.

In order to set the sharing voltage V1 at 150 V, that is, the withstand voltage VB, or V1+V2 at 300 V, the thicknesses T1 of the first high resistance drift layer 22 without taking the high resistance buried layer 26 into consideration must be the maximum thickness T1MAX of 6.5 $\mu m$ or greater expressed by the equation (5), at which the depletion layer extending over the first high resistance drift layer 22 reaches through the drain region 21. However, the withstand voltage VB can become 300 V even if the thickness T1 is smaller than the thickness T1MAX of 6.5 $\mu m$ in consideration of the high resistance buried layer 26, as illustrated in FIG. 3. The thickness T1 of the first high resistance drift layer 22 can be made smaller than the maximum thickness T1MAX, at which the depletion layer extending over the first high resistance drift layer 22 reaches through the drain region 21, and therefore, can be expressed as follows:

$$T1 < 6.5 \, \mu m \quad (6)$$

It is found from FIG. 3 that the thickness T1 at which the ON resistance Ron at a withstand voltage VB of 300 V becomes minimum ranges from 3 $\mu m$ to 4 $\mu m$.

Furthermore, as illustrated in the graph of FIG. 3, a maximum value can be obtained at each of the levels when T1<6.5 $\mu m$. If the point of the maximum value is selected as a design value, fluctuations of the withstand voltage VB become smaller than those of the impurity concentration N1 in comparison with the case where a point on a straight line is selected as a design value. Consequently, the thickness T1, which takes a maximum value at a withstand voltage VB of 300 V, can be set to a design value. It is found from FIG. 3 that the thickness T1 takes the optimum value at a level slightly greater than 3 $\mu m$ within the range from 3 $\mu m$ to 4 $\mu m$. For this reason, the impurity concentration N1 at the maximum withstand voltage can be selected as a design value, and therefore, it is understood that an optimum value of the impurity concentration N1 is about $2.6 \times 10^{15}$ cm$^{-3}$.

Explanation will be made on the operation of the MOSFET having the above-described arrangement.

First, an ON operation will be explained below. When a voltage higher than a threshold voltage is applied to the gate electrode 28 in a state in which a voltage having positive potential on the drain electrode 31 side is applied between the drain electrode 31 and the source electrode 30, an N type channel region is formed on the surface layer in the base region 24 right under the gate electrode 28, so that an electron flows from the source electrode to the drain electrode through the source region, the channel region, the second high resistance drift layer, the first high resistance drift layer and the drain region, thereby achieving electric conduction between the drain electrode 31 and the source electrode 30, that is, making the MOSFET operative. Since the ON resistance at this time is designed as described above, the thickness T1 of the first high resistance drift layer 22 can be reduced more than the case where the maximum thickness T1MAX of the first high resistance drift layer 22 is set to 6.5 $\mu m$ or greater, at which the depletion layer extending over the first high resistance drift layer 22 reaches through the drain region 21, as expressed by the equation (5).

Next, an OFF operation will be explained below. Since no N type channel region is formed on the surface layer in the base region 24 right under the gate electrode 28 even if the voltage having positive potential on the drain electrode 31 side is applied between the drain electrode 31 and the source electrode 30 in the state in which the voltage lower than the threshold voltage is applied to the gate electrode 28, no electric conduction is established between the drain electrode 31 and the source electrode 30 via the channel region, and therefore, the MOSFET is kept to be inoperative. In this OFF state, the depletion layer formed within the second high resistance drift layer 23 extending from the PN junction between the base region 24 and the second high resistance drift layer 23 shares the voltage until a voltage applied between the drain electrode 31 and the source electrode 30 reaches up to 150 V. When the applied voltage exceeds 150 V, the depletion layer extending over the second high resistance drift layer 23 reaches part of the high resistance buried layer 26, thereby causing a punch-through state. Consequently, the second high resistance drift layer 23 shares a voltage of 150 V out of the applied voltage, and further, the depletion layer formed within the first high resistance drift layer 22 extending from the PN junction between the high resistance buried layer 26 and the first high resistance drift layer 22 shares the voltage exceeding 150 V out of the applied voltage. Since the thickness T1 of the first high resistance drift layer 22 is set smaller than T1MAX, the depletion layer extending over the first high resistance drift layer 22 reaches the drain region 21 at the applied voltage lower than 300 V, and therefore, hardly extends in the reach-through state. At this time, the high resistance buried layer 26 is not filled with the depletion layer extending from the PN junction between the high resistance buried layer 26 and the first high resistance drift layer 22. Therefore the first high resistance drift layer 22 shares the amount exceeding 150 V out of the applied voltage till complete depletion of the high resistance buried layer 26, thus securing a withstand voltage VB of 300 V in the MOSFET.

Hereinafter, a method for fabricating the MOSFET having the above-described configuration will be explained in reference to FIG. 4.

Figure 4A:
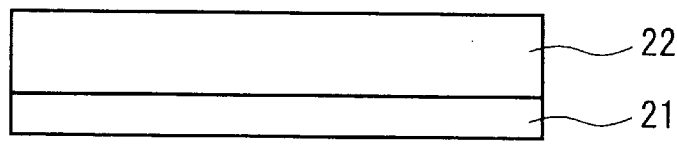
FIGS. 4(a), (b) and (c) are cross-sectional views showing essential parts in a method for fabricating the MOSFET shown in FIG. 1, in the order of processes.

(a) In a first process, the N-type first high resistance drift layer 22 is epitaxially grown on the N+ type silicon substrate 21, as the completion of this process is illustrated in FIG. 4A.

Figure 4B:
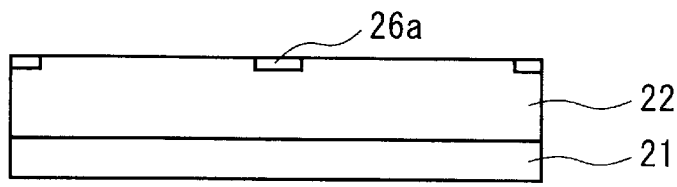

(b) In a second process, an ion implanted layer 26a for the high resistance buried layer 26 is formed on the surface layer of the first high resistance drift layer 22 by ion implantation while a resist pattern is used as a mask in accordance with a photo mask process after the completion of the first process, and then, the resist pattern is removed, as the completion of this process is illustrated in FIG. 4B. Here, the ion implanted layer 26a may be formed by the ion implantation a plurality of times while an acceleration voltage is varied.

Figure 4C:
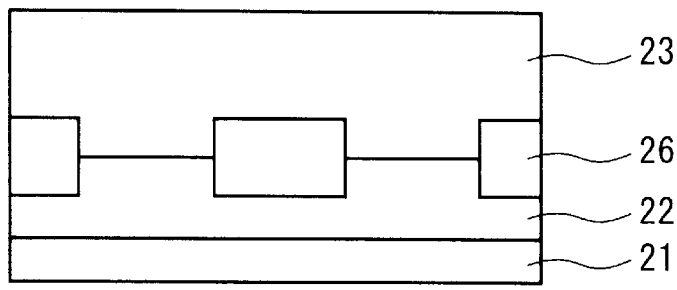

(c) In a third process, the N– type second high resistance drift layer 23 is epitaxially grown on the first high resistance drift layer 22 after the completion of the second process, followed by thermally pushing the ion implanted layer 26a, and then, the high resistance buried layer 26 is formed on the surface layer of the first high resistance drift layer 22 and on the bottom layer of the second high resistance drift layer 23, as the completion of this process is illustrated in FIG. 4C.

(d) In a fourth process, the P type base region 24, the N+type source region 25, the gate oxide 27, the gate electrode 28, the interlayer insulating film 29 and the source electrode 30 are formed on the surface layer of the second high resistance drift layer 23 and over the second high resistance drift layer 23 while the drain electrode 31 is formed at the other main surface of the silicon substrate 21 by a well-known technique after the completion of the third process, as the completion of this process is illustrated in FIG. 1.

As described above, although the first high resistance drift layer 22 and the second high resistance drift layer 23 equally share the withstand voltage VB of 300 V, i.e., 150 V, the impurity concentration N1 and thickness T1 of the first high resistance drift layer 22 can be designed to the optimum values, respectively, based on the relationship illustrated in FIG. 3, thereby resulting in N1>N2 and T1<T2. Thus, the ON resistance component caused by the first high resistance drift layer 22 becomes less than that caused by the second high resistance drift layer 23, so that the trade-off relationship between the ON resistance and the withstand voltage can be improved more than in the vertical type MOSFET, which has been disclosed in un examined Japanese Patent Publication (KOKAI) No. 9-191109.

(Second Embodiment)

Subsequently, a vertical type MOSFET having a trench gate structure in a second embodiment according to the present invention will be described below with reference to FIG. 5.

Figure 5:
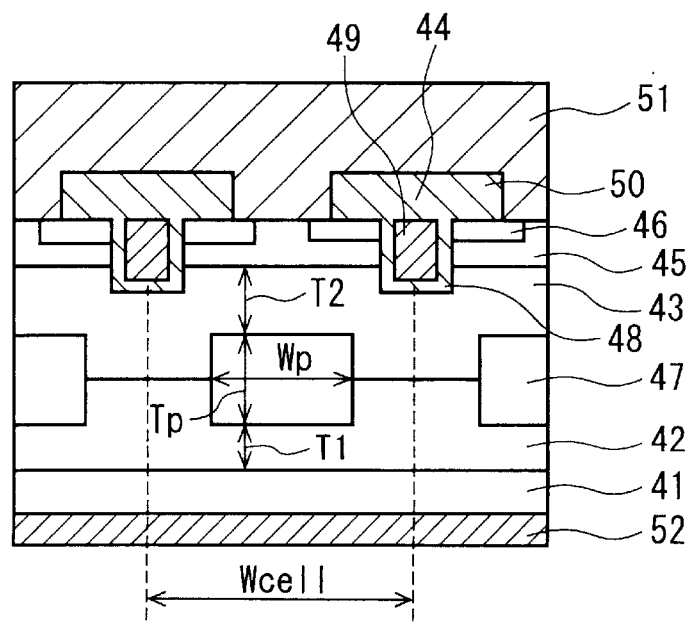
FIG. 5 is a cross-sectional view showing essential parts of a MOSFET according to a second preferred embodiment in the present invention.

In FIG. 5, reference numeral 41 designates an N+type silicon substrate serving as an N+type drain region. At one of main surfaces of the silicon substrate 41 is arranged an N–type first high resistance drift layer 42. On the first high resistance drift layer 42 is arranged an N–type second high resistance drift layer 43. A trench 44 having a grid-like planar pattern is formed in the surface layer of the second high resistance drift layer 43. A P type base region 45 is arranged on the surface layer of the second high resistance drift layer 43 surrounded by the trench 44. An N+type source region 46 is arranged on the surface layer of the base region 45. A P–type high resistance buried layer 47 is arranged on the surface layer of the first high resistance drift layer 42 and the bottom layer of the second high resistance drift layer 43 at a position right under each of the base regions 45. A gate electrode 49 is buried in the trench 44 via a gate oxide 48. A source electrode 51 is arranged in ohmic contact with the source region 46 over the base region 45 and the source region 46 and the source electrode 51 is insulated from the gate electrode 49 by an interlayer insulating film 50. A drain electrode 52 is arranged at the other main surface of the silicon substrate 41. With the above-described arrangement, the impurity concentration N1 and thickness T1 of the first high resistance drift layer 42, which is a feature of the present invention, are set to optimum values, respectively, and an ON resistance is minimum, when the first high resistance drift layer 42 shares a sharing voltage V1 of a withstand voltage VB between the source and drain electrodes in the MOSFET.

Design examples of the first high resistance drift layer 42, the second high resistance drift layer 43 and the high resistance buried layer 47 are the same as those of the first high resistance drift layer 22, the second high resistance drift layer 23 and the high resistance buried layer 26 in the first embodiment, and therefore, their explanations will be omitted hereinafter.

Moreover, operation of the MOSFET such configured as above is identical to that of the MOSFET in the first embodiment, and therefore, its explanation will be omitted hereinafter.

Additionally, a method for fabricating the MOSFET such configured as above till the formation of the first high resistance drift layer 42, the second high resistance drift layer 43 and the high resistance buried layer 47 is similar to the method for fabricating the first high resistance drift layer 22, the second high resistance drift layer 23 and the high resistance buried layer 26 in the MOSFET in the first embodiment, and further, the trench 44, the base region 45, the source region 46, the gate oxide 48, the gate electrode 49, the interlayer insulating film 50, the source electrode 51 and the drain electrode 52 can be formed by a well-known technique. Therefore, their explanations will be omitted hereinafter.

(Third Embodiment)

Subsequently, a termination structure in a vertical type MOSFET in a third embodiment according to the present invention will be described below with reference to FIG. 6. This termination structure is provided with the MOSFET described in the first embodiment as a cell unit, for inhibiting degradation of a withstand voltage at a device termination in the planar structure. The same component parts as those illustrated in FIG. 1 are designated by the same reference numerals, and therefore, their explanation will be omitted hereinafter. Only the termination structure will be explained below.

Figure 6:
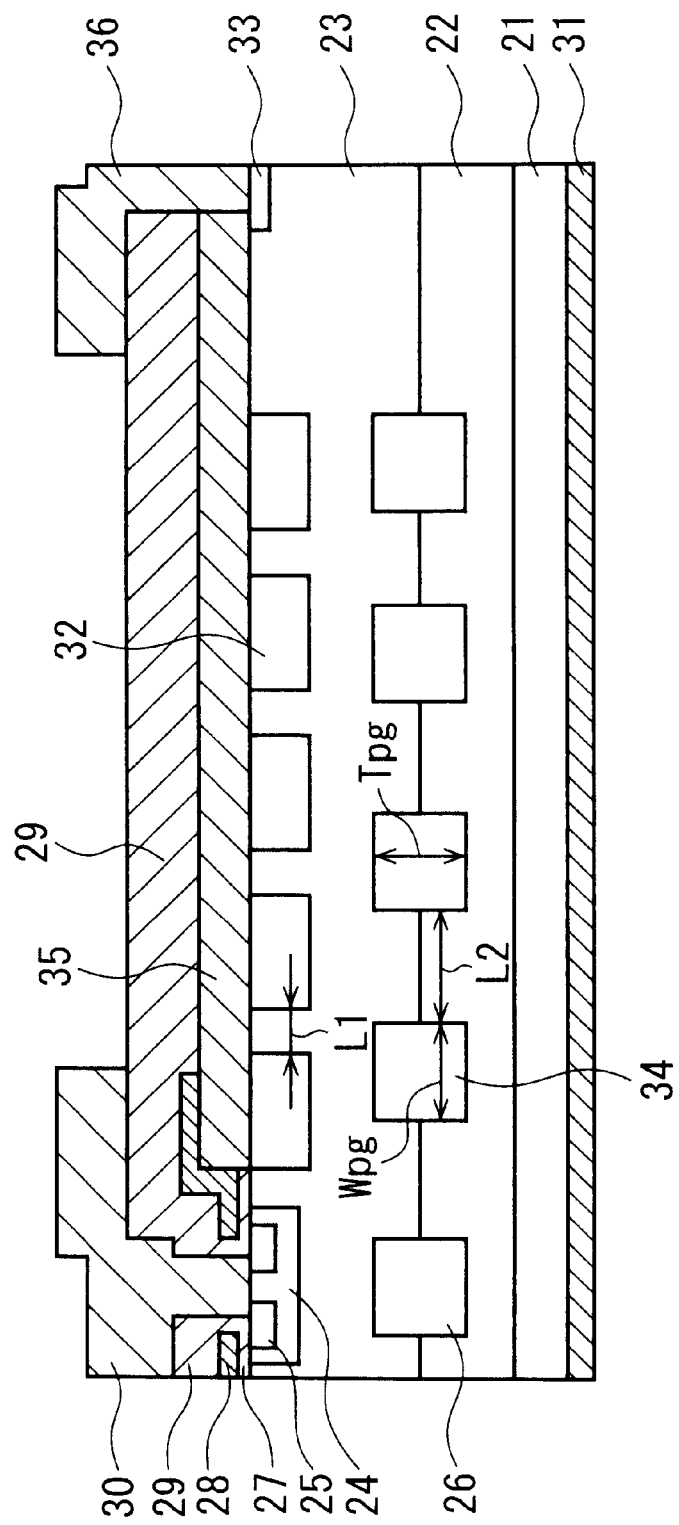
FIG. 6 is a cross-sectional view showing essential parts in a terminal structure of a MOSFET according to a third preferred embodiment in the present invention.

In FIG. 6, a plurality of P-type guard ring layers 32 surrounding a plurality of base regions 24 and an N+type channel stopper layer 33 surrounding the guard ring layers 32 at a peripheral end are arranged on the surface layer of a second high resistance drift layer 23 at the device termination.

A plurality of P-type buried guard ring layers 34 respectively surrounding high resistance buried layers 26 are arranged on the surface layer of a first high resistance drift layer 22 and the bottom layer of the second high resistance drift layer 23 at the device termination. A field oxide film 35 is arranged on the second high resistance drift layer 23 and the guard ring layers 32 at the device termination. A channel stopper electrode 36 is arranged on the channel stopper layer 33.

Each of the buried guard ring layers 34 is designed such that its width Wpg and thickness Tpg become substantially equal to the width Wp and thickness Tp of the high resistance buried layer 26, and that a distance L1 between the guard ring layers 32 and a distance L2 between the buried guard ring layers 34 satisfy the relationship of L1<L2, thereby suppressing an increase in electric field and alleviating the concentration of the electric field at the device termination, and further, securely depleting the high resistance buried layer 26 at an outermost cell unit in a reach-through state, so as to inhibit any degradation of the withstand voltage at the device termination. Incidentally, although the MOSFET described in the first embodiment is used as the cell unit in the present embodiment, the present invention also is applicable to the case where the MOSFET described in the second embodiment is used as the cell unit.

(Fourth Embodiment)

A vertical type MOSFET having a gate planar structure in a fourth embodiment will be described below with reference to FIG. 7.

Figure 7:
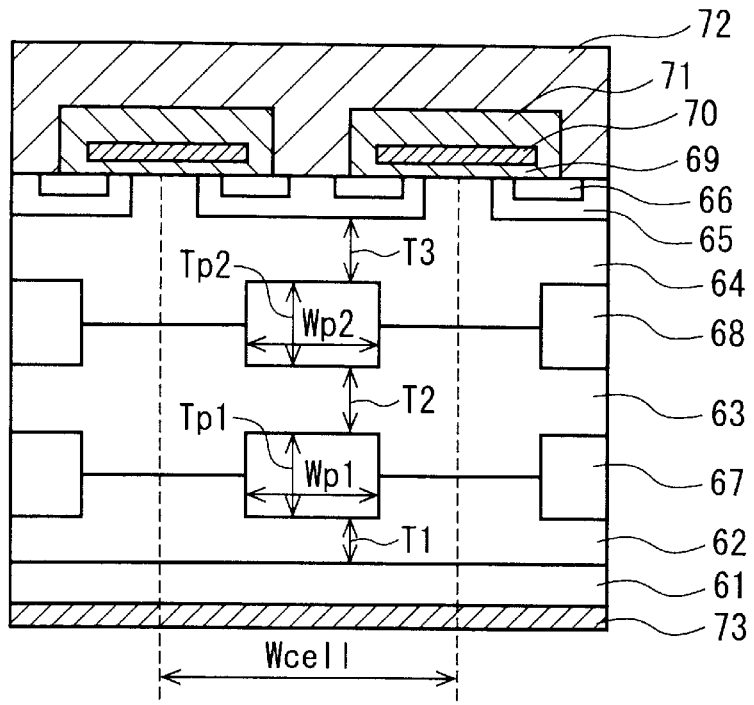
FIG. 7 is a cross-sectional view showing essential parts of a MOSFET according to a fourth preferred embodiment in the present invention.
Figure 8:
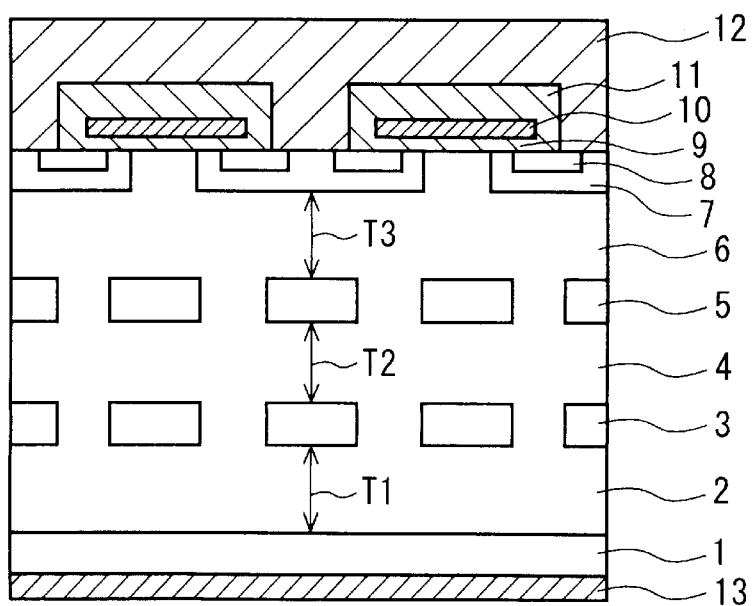
FIG. 8 is a cross-sectional view showing essential parts of a semiconductor device in the prior art.

In FIG. 7, reference numeral 61 designates an N+type silicon substrate serving as an N+type drain region. At one of main surfaces of the silicon substrate 61 is arranged an N type first high resistance drift layer 62. On the first high resistance drift layer 62 is arranged an N–type second high resistance drift layer 63. On the second high resistance drift layer 63 is arranged an N–type third high resistance drift layer 64. A plurality of P type base regions 65 in a planar pattern of a square cell are arranged on the surface layer of the third high resistance drift layer 64. A source region 66 is arranged on the surface layer of the base region 65. A P–type first high resistance buried layer 67 is arranged on the surface layer of the first high resistance drift layer 62 and the bottom layer of the second high resistance drift layer 63 at a position right under each of the base regions 65. Similarly, a P–type second high resistance buried layer 68 is arranged on the surface layer of the second high resistance drift layer 63 and the bottom layer of the third high resistance drift layer 64 at a position right under each of the base regions 65. A gate electrode 70 is arranged over a base region 65 held between the third high resistance drift layer 64 and the source region 66 via a gate oxide 69. A source electrode 72 is arranged in ohmic contact with the source region 66 over the base region 65 and the source region 66 and the source electrode 72 is insulated from the gate electrode 70 by an interlayer insulating film 71. A drain electrode 73 is arranged at the other main surface of the silicon substrate 61. Reference character Wcell represents a cell size; T1, the thickness of the first high resistance drift layer 62; T2, the thickness of the second high resistance drift layer 63; T3, the thickness of the third high resistance drift layer 64; Wp1, the width of the first high resistance buried layer 67; Tp1, the thickness of the first high resistance buried layer 67; Wp2, the width of the second high resistance buried layer 68; and Tp2, the thickness of the second high resistance buried layer 68. Here, the thickness T1 represents the shortest distance between the silicon substrate 61 and the first high resistance buried layer 67; the thickness T2, the shortest distance between the first high resistance buried layer 67 and the second high resistance buried layer 68; and the thickness T3, the shortest distance between the base region 65 and the second high resistance buried layer 68. With the above-described arrangement, the impurity concentration N1 and thickness T1 of the first high resistance drift layer 62, which is a feature of the present invention, are set to optimum values, respectively, and an ON resistance is minimum when the first high resistance drift layer 62 shares a sharing voltage V1 of a withstand voltage VB between the source and drain electrodes in the MOSFET.

Subsequently, explanation will be made on a design example of the MOSFET having the above-described arrangement. The withstand voltage VB between the source and drain electrodes in the MOSFET is set to 600 V, and a withstand voltage VB of 600 V is shared among the first high resistance drift layer 62, the second high resistance drift layer 63 and the third high resistance drift layer 64 by the equal amount, i.e., at voltages V1, V2 and V3 of 200 V.

First, a description will be given below of a design example of the impurity concentrations N2 and N3 and thicknesses T2 and T3 of the second high resistance drift layer 63 and the third high resistance drift layer 64.

From FIG. 2, the impurity concentrations N2 and N3 of the second high resistance drift layer 63 and the third high resistance drift layer 64 are $1.6 \times 10^{15}$ [cm$^{-3}$] in the case of a sharing voltage V2 or V3 of 200 V in the same manner as in the first embodiment.

In the meantime, the thicknesses T2 and T3 of the second high resistance drift layer 63 and the third high resistance drift layer 64 are set to dimensions lower than the E critical (i.e., an electric field critical value at which an avalanche breakdown occurs) in the same manner as in the first embodiment. In the present embodiment, the thicknesses T2 and T3 are designed to be 7 μm to 8 μm.

Next, the first high resistance buried layer 67 and the second high resistance buried layer 68 are designed in the same manner as in the first embodiment. The widths Wp1 and Wp2 of the first high resistance buried layer 67 and the second high resistance buried layer 68 are designed to become substantially half of the cell size Wcell. Moreover, the thicknesses Tp1 and Tp2 of the first high resistance buried layer 67 and the second high resistance buried layer 68 are designed to become substantially equal to the widths Wp1 and Wp2, and further, the resistivities of the first high resistance buried layer 67 and the second high resistance buried layer 68 are designed to become substantially equal to those of the second high resistance drift layer 63 and the third high resistance drift layer 64.

Subsequently, a description will be given below of a design example of the impurity concentration N1 and thickness T1 of the first high resistance drift layer 62. In the same manner as in the first embodiment, when the maximum thickness T1MAX of the first high resistance drift layer 62, at which a depletion layer formed within the first high resistance drift layer 62 extending from a PN junction between the first high resistance buried layer 67 and the first high resistance drift layer 62 reaches through the drain layer 61, at a sharing voltage V1 of 200 V, is determined in accordance with the equation (4), the maximum thickness T1MAX can be expressed by the following equation:

$$T1MAX = 9 \, \mu m \quad (7)$$

Next, the simulation of the relationship between the withstand voltage VB and a normalized ON resistance Ron in the MOSFET in which the second high resistance drift layer 63, the third high resistance drift layer 64, the first high resistance buried layer 67 and the second high resistance buried layer 68 are designed as described above, while the impurity concentration N1, thickness T1 and sharing voltage V1 of the first high resistance drift layer 62 are variables, can be expressed in a two-dimensional graph in which an X axis represents the ON resistance Ron and a Y axis represents the withstand voltage VB while the thickness T1 at around T1MAX of 9 μm expressed by the equation (7) takes a plurality of levels, similarly to FIG. 3, although not illustrated.

In order to set the sharing voltage V1 at 200 V, that is, the withstand voltage VB, or V1+V2+V3 at 600 V, the thicknesses T1 of the first high resistance drift layer 62 without taking the first high resistance buried layer 67 into consideration must be the maximum thickness T1MAX of 9 μm or greater expressed by the equation (7), at which the first high resistance drift layer 62 reaches through the drain region 61. However, the withstand voltage VB can become 600 V even if the thickness T1 is smaller than the thickness T1MAX of 9 μm in consideration of the first high resistance buried layer 67, in the same manner as in FIG. 3. The thickness T1 of the first high resistance drift layer 62 can be made smaller than the maximum thickness T1MAX, at which the first high resistance drift layer 62 reaches through the drain region 61, and therefore, can be expressed as follows:

$$T1 < 9 \ \mu m \qquad (8)$$

In the same manner as illustrated in FIG. 3, the thickness T1 at which the ON resistance Ron at a withstand voltage VB of 600 V becomes minimum falls within the range expressed by the inequality (8).

Furthermore, in the same manner as illustrated in FIG. 3, a maximum value can be obtained at each of the levels when T1<9 μm. If the point of the maximum value is selected as a design value, fluctuations of the withstand voltage VB become smaller than those of the impurity concentration N1 in comparison with the case where a point on a straight line is selected as a design value. Consequently, the thickness T1, which takes a maximum value at a withstand voltage VB of 600 V, can be set to a design value. In the same manner as illustrated in FIG. 3, the optimum value falls within the range expressed by the inequality (8). A value at the maximum thickness can be selected as a design value of the impurity concentration N1. As the optimum values of the impurity concentration N1 and thickness T1 of the first high resistance drift layer 62, for example, $1.8 \times 10^{15}$ [cm$^{-3}$] is selected as the impurity concentration N1 and 6 μm is selected as the thickness T1.

Explanation will be made on the operation of the MOSFET having the above-described arrangement.

First, an ON operation will be explained below. When a voltage higher than a threshold voltage is applied to the gate electrode 70 in a state in which a voltage having positive potential on the drain electrode 73 side is applied between the drain electrode 73 and the source electrode 72, an N type channel region is formed on the surface layer in the base region 65 right under the gate electrode 70, so that an electron flows from the source electrode 72 to the drain electrode 73 through the source region 66, the channel region, the third high resistance drift layer 64, the second high resistance drift layer 63, the first high resistance drift layer 62 and the drain region 61, thereby achieving electric conduction between the drain electrode 73 and the source electrode 72, that is, making the MOSFET operative. Since the ON resistance at this time is designed as described above, the thickness T1 of the first high resistance drift layer 62 can be reduced more than the case where the maximum thickness T1MAX of the first high resistance drift layer 62 is set to 9 μm or greater, at which the first high resistance drift layer 62 reaches through the drain region 61, as expressed by the equation (7).

Next, an OFF operation will be explained below. Since no N type channel region is formed on the surface layer in the base region 65 right under the gate electrode 70 even if the voltage having positive potential on the drain electrode 73 side is applied between the drain electrode 73 and the source electrode 72 in the state in which the voltage lower than the threshold voltage is applied to the gate electrode 70, no electric conduction is established between the drain electrode 73 and the source electrode 72 via the channel region, and therefore, the MOSFET is kept to be inoperative. In this OFF state, the depletion layer formed within the third high resistance drift layer 64 extending from the PN junction between the base region 65 and the third high resistance drift layer 64 shares the voltage until a voltage applied between the drain electrode 73 and the source electrode 72 reaches up to 200 V. When the applied voltage exceeds 200 V, the depletion layer extending over the third high resistance drift layer 64 reaches part of the second high resistance buried layer 68, thereby causing a punch-through state. Consequently, the third high resistance drift layer 64 shares a voltage of 200 V out of the applied voltage. The depletion layer formed within the second high resistance drift layer 63 extending from the PN junction between the second high resistance buried layer 68 and the second high resistance drift layer 63 shares the voltage by the amount exceeding 200 V out of the applied voltage until the applied voltage reaches up to 400 V. When the applied voltage exceeds 400 V, the depletion layer extending over the second high resistance drift layer 63 reaches part of the first high resistance buried layer 67, thereby causing a punch-through state. Consequently, the second high resistance drift layer 63 shares a voltage of 200 V out of the applied voltage. And further, the depletion layer formed within the first high resistance drift layer 62 extending from the PN junction between the first high resistance buried layer 67 and the first high resistance drift layer 62 shares the voltage by the amount exceeding 200 V out of the applied voltage. Since the thickness T1 of the first high resistance drift layer 62 is set smaller than T1MAX, the depletion layer extending over the first high resistance drift layer 62 reaches the drain region 61 at the applied voltage lower than 600 V, and therefore, hardly extends in the reach-through state. At this time, the selection of the optimum values of the concentration and thickness of the first high resistance drift layer 62 can prevent any occurrence of depletion of the first high resistance buried layer 67 by the depletion layer formed within the first high resistance buried layer 67 extending from the PN junction between the first high resistance buried layer 67 and the first high resistance drift layer 62. Since the voltage is shared by the amount exceeding 400 V out of the applied voltage till complete depletion of the first high resistance buried layer 67, the first high resistance drift layer 62 can share the voltage by 200 V out of the applied voltage, thus securing a withstand voltage VB of 600 V in the MOSFET.

Next, explanation will be made on a method for fabricating the MOSFET having the above-described configuration. The first high resistance drift layer 62, the second high resistance drift layer 63 and the first high resistance buried layer 67 are formed in the same manner as the first high resistance drift layer 22, the second high resistance drift layer 23 and the high resistance buried layer 26 in the MOSFET in the first embodiment. Subsequently, the second high resistance buried layer 68 and the third high resistance drift layer 64 are formed in the same manner as the first high resistance buried layer 67 and the second high resistance drift layer 63. Thereafter, the base region 65, the source region 66, the gate oxide film 69, the gate electrode 70, the interlayer insulating film 71 and the source electrode 72 are formed on the surface layer of the third high resistance drift layer 64 and over the third high resistance drift layer 64 while the drain electrode 73 is formed at the other main surface of the silicon substrate 61 by a well-known technique.

Although one conductive type denotes the N type and the other conductive type denotes the P type in the above-described embodiments, one conductive type may denote the P type and the other conductive type may denote the N type.

Furthermore, although the planar pattern of the base region is a square cell-like pattern in the description in the first and fourth embodiments, the cell pattern may be polygonal or circular, or the pattern may be a stripe pattern. The planar pattern of the high resistance buried layer also may be polygonal or circular, or the pattern may be a stripe pattern.

Moreover, although the planar pattern of the trench is the grid pattern in the description in the second embodiment, it may be a stripe pattern. Additionally, the shape of a grid hole (i.e., a region surrounded by the trench) in the grid pattern may be rectangular, polygonal or circular.

According to the present invention, the thickness T1 of the first high resistance drift layer is set in such a manner that the depletion layer extending over the first high resistance drift layer reaches through the drain region when the voltage lower than the sharing voltage V1 shared by the first high resistance drift layer is applied to the PN junction between the first high resistance buried layer and the first high resistance drift layer, thereby securing the sharing voltage V1 by the extension of the depletion layer over the P-type high resistance buried layer after the reach-through. Thus, it is possible to further improve the relationship of the trade-off between the ON resistance and the withstand voltage in the semiconductor device.

Moreover, the thickness T1 of the first high resistance drift layer is set in such a manner that the ON resistance Ron becomes minimum at the predetermined withstand voltage VB by using the three-dimensional graph in which the X axis represents the ON resistance Ron, the Y axis represents the withstand voltage VB and the Z axis represents the thickness T1. Thus, it is possible to provide the semiconductor device in which the relationship of the trade-off between the ON resistance and the withstand voltage is optimum.

Additionally, the thickness T1 of the first high resistance drift layer is set in such a manner that the withstand voltage becomes maximum at the predetermined withstand voltage VB with respect to the ON resistance by using the three-dimensional graph in which the X axis represents the ON resistance Ron, the Y axis represents the withstand voltage VB and the Z axis represents the thickness T1. Thus, it is possible to suppress fluctuations of the withstand voltage VB with respect to fluctuations of the impurity concentration N1, so as to provide the semiconductor device in which the relationship of the trade-off between the ON resistance and the withstand voltage is optimum.

What is claimed is:

1. A semiconductor device comprising:
   a semiconductor substrate serving as a drain region of one conductive type;
   a first high resistance drift layer of one conductive type provided on a surface of said semiconductor substrate;
   second to (n+1)th high resistance drift layers of one conductive type provided on said first high resistance drift layer (wherein n is an integer of 1 or more);
   a base region of other conductive type provided on a surface layer of said (n+1)th high resistance drift layer;
   a source region of one conductive type provided on a surface layer of said base region; a first high resistance buried layer of other conductive type provided on a surface layer of said first high resistance drift layer and a bottom layer of said second high resistance drift layer at a position right under said base region;
   second to nth high resistance buried layers of other conductive type respectively provided on surface layers of said second to nth high resistance drift layers and bottom layers of said third to (n+1)th high resistance drift layers at a position right under said base region;
   a gate electrode provided on said base region held between said (n+1)th high resistance drift layer and said source region via a gate oxide film;
   a source electrode in ohmic contact with said source region over said base region and said source region; and
   a drain electrode provided on the other surface of said semiconductor substrate;
   wherein a thickness of said first high resistance drift layer being established in such a manner that a depletion layer formed within said first high resistance drift layer reaches through said drain region, when a voltage lower than a sharing voltage shared by said first high resistance drift layer out of a predetermined withstand voltage between said source electrode and said drain electrode is applied to a PN junction between said first high resistance buried layer and said first high resistance drift layer.

2. The semiconductor device according to claim 1, wherein said thickness of said first high resistance drift layer is established in such a manner that an ON resistance becomes minimum at a predetermined withstand voltage of said semiconductor device by using a graph in which variables thereof are an ON resistance, a withstand voltage, and said thickness of said first high resistance drift layer of said semiconductor device.

3. The semiconductor device according to claim 1, wherein said thickness of said first high resistance drift layer is established in such a manner that said withstand voltage of said semiconductor device becomes maximum by using a graph in which variables thereof are an ON resistance, a withstand voltage and said thickness of said first high resistance drift layer of said semiconductor device.

4. The semiconductor device according to claim 3, wherein an impurity concentration of said first high resistance drift layer is an impurity concentration at a maximum withstand voltage of said semiconductor device.

5. The semiconductor device according to claim 1, wherein said thickness of said first high resistance drift layer is smaller than that of each of said second to (n+1)th high resistance drift layers.

6. The semiconductor device according to claim 1, further comprising:
   a plurality of guard ring layers of other conductive type provided on a surface layer of said (n+1)th high resistance drift layer so as to surround said plurality of base regions;
   a plurality of first buried guard ring layers of other conductive type provided on said surface layer of said first high resistance drift layer and said bottom layer of said second high resistance drift layer under said guard ring layer so as to surround said first high resistance buried layer; and
   a plurality of second to nth buried guard ring layers of other conductive type provided on surface layers of said second to nth high resistance drift layers and bottom layers of said third to (n+1)th high resistance drift layers under said guard ring layer so as to respectively surround said second to nth high resistance buried layers.

7. A semiconductor device comprising:

a semiconductor substrate serving as a drain region of one conductive type;

a first high resistance drift layer of one conductive type provided on a surface of said semiconductor substrate;

a second high resistance drift layer of one conductive type provided on said first high resistance drift layer;

a base region of other conductive type provided on a surface layer of said second resistance drift layer;

a source region of one conductive type provided on a surface layer of said base region;

a first high resistance buried layer of other conductive type provided on a surface layer of said first high resistance drift layer and a bottom layer of said second high resistance drift layer at a position right under said base region;

a gate electrode provided on said base region held between said second high resistance drift layer and said source region via a gate oxide film;

a source electrode in ohmic contact with said source region over said base region and said source region; and a drain electrode provided on the other surface of said semiconductor substrate;

wherein a thickness of said first high resistance drift layer being established in such a manner that a depletion layer formed within said first high resistance drift layer reaches through said drain region, when a voltage lower than a sharing voltage shared by said first high resistance drift layer out of a predetermined withstand voltage between said source electrode and said drain electrode is applied to a PN junction between said first high resistance buried layer and said first high resistance drift layer.

8. A semiconductor device comprising:

a semiconductor substrate serving as a drain region of one conductive type;

a first high resistance drift layer of one conductive type provided on a surface of said semiconductor substrate;

second to (n+1)th high resistance drift layers of one conductive type provided on said first high resistance drift layer (wherein n is an integer of 1 or more);

a base region of other conductive type provided on a surface layer of said (n+1)th high resistance drift layer;

a source region of one conductive type provided on a surface layer of said base region;

a first high resistance buried layer of other conductive type provided on a surface layer of said first high resistance drift layer and a bottom layer of said second high resistance drift layer at a position right under said base region;

second to nth high resistance buried layers of other conductive type respectively provided on surface layers of said second to nth high resistance drift layers and bottom layers of said third to (n+1)th high resistance drift layers at a position right under said base region;

a trench provided on a surface of said (n+1)th high resistance drift layer so as to penetrate said source region and base region;

a gate oxide film formed on an inner surface of said trench;

a gate electrode disposed within said trench;

a source electrode in ohmic contact with said source region over said base region and said source region; and a drain electrode provided on the other surface of said semiconductor substrate;

wherein a thickness of said first high resistance drift layer being established in such a manner that a depletion layer formed within said first high resistance drift layer reaches through said drain region, when a voltage lower than a sharing voltage shared by said first high resistance drift layer out of a predetermined withstand voltage between said source electrode and said drain electrode is applied to a PN junction between said first high resistance buried layer and said first high resistance drift layer.

9. A semiconductor device comprising:

a semiconductor substrate serving as a drain region of one conductive type;

a first high resistance drift layer of one conductive type provided on a surface of said semiconductor substrate;

a second high resistance drift layer of one conductive type provided on said first high resistance drift layer;

a base region of other conductive type provided on a surface layer of said second resistance drift layer;

a source region of one conductive type provided on a surface layer of said base region;

a first high resistance buried layer of other conductive type provided on a surface layer of said first high resistance drift layer and a bottom layer of said second high resistance drift layer at a position right under said base region;

a trench provided on a surface of said second high resistance drift layer so as to penetrate said source region and base region;

a gate oxide film formed on an inner surface of said trench;

a gate electrode disposed within said trench;

a source electrode in ohmic contact with said source region over said base region and said source region; and a drain electrode provided on the other surface of said semiconductor substrate;

wherein a thickness of said first high resistance drift layer being established in such a manner that a depletion layer formed within said first high resistance drift layer reaches through said drain region, when a voltage lower than a sharing voltage shared by said first high resistance drift layer out of a predetermined withstand voltage between said source electrode and said drain electrode is applied to a PN junction between said first high resistance buried layer and said first high resistance drift layer.

* * * * *